(12) United States Patent
Giltner

(10) Patent No.: US 6,259,842 B1
(45) Date of Patent: Jul. 10, 2001

(54) MONITORING SYSTEM FOR A HIGH POWER LIGHT SOURCE

(75) Inventor: David M. Giltner, Fremont, CA (US)

(73) Assignee: SDL, Inc., San Jose, CA (US)

( * ) Notice: Subject to any disclaimer, the term of this patent is extended or adjusted under 35 U.S.C. 154(b) by 0 days.

(21) Appl. No.: 09/335,982

(22) Filed: Jun. 17, 1999

(51) Int. Cl.[7] ................................................ G02B 6/26
(52) U.S. Cl. ............................ 385/48; 385/42; 385/39; 385/140; 385/147
(58) Field of Search ............................. 385/15, 42, 43, 385/31, 47, 48, 140, 147, 24; 359/115, 124

(56) References Cited

U.S. PATENT DOCUMENTS

| | | | | |
|---|---|---|---|---|
| 4,768,849 | * | 9/1988 | Hicks, Jr. ........................ | 385/48 X |
| 5,077,816 | * | 12/1991 | Glomb et al. ..................... | 385/37 |
| 5,185,814 | * | 2/1993 | Healey ............................ | 385/24 |
| 5,251,278 | * | 10/1993 | Samborsky ....................... | 385/48 |
| 5,311,613 | * | 5/1994 | Stieb et al. ..................... | 385/140 |
| 5,432,875 | * | 7/1995 | Korkowski et al. ................ | 385/27 |
| 5,923,450 | * | 7/1999 | Dugan et al. .................... | 359/127 |
| 6,088,497 | * | 7/2000 | Phillips et al. .................. | 385/48 |
| 6,144,793 | * | 11/2000 | Matsumoto et al. ................ | 385/140 |

\* cited by examiner

*Primary Examiner*—Brian Healy
(74) *Attorney, Agent, or Firm*—W. Douglas Carothers, Jr.

(57) ABSTRACT

A monitoring apparatus for a high power light source comprises a fiber medium containing a high power output for an application with a first monitoring tap optically coupled to the fiber medium for removing a small portion of light from the output to monitor the output power level. A photodetector is optically coupled to receive the light portion to monitor the output power level. The photodetector, however, has a predetermined saturation level below the power level provided from the first monitoring tap. Therefore, at least one light attenuator is provided between the first monitoring tap and the photodetector to provide a level of monitoring power within a range below the saturation level of the photodetector to accurately monitor changes in the output power present on the fiber medium of the light source. The attenuator may be an optical tap; a beamsplitter, such as a fiber beamsplitter; a WDM splitter; a fused coupler; a bulk optical filter or other micro-optic filter; misaligned, coupled optical fibers; or a fiber bound into a tight loop or coil to provide for optical dispersion loss from the fiber.

14 Claims, 1 Drawing Sheet

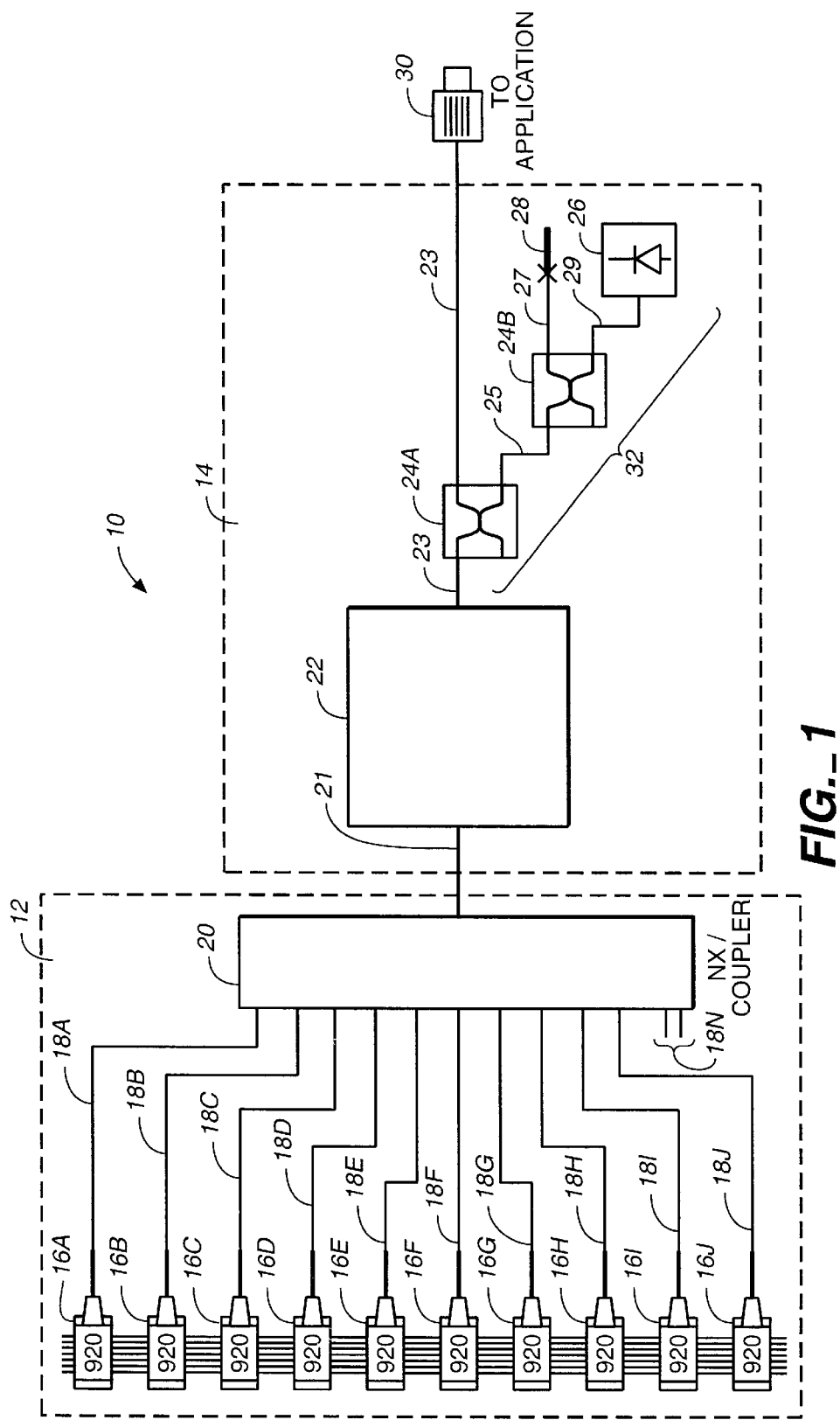
FIG._1

MONITORING SYSTEM FOR A HIGH POWER LIGHT SOURCE

FIELD OF THE INVENTION

This invention relates generally to an optical monitoring system and, more particularly, to monitoring apparatus for a high power light source, such as a fiber amplifier or fiber laser or other such fiber resonator providing light output on a fiber medium.

BACKGROUND OF THE INVENTION

It is common practice to have an optical monitoring system coupled to the output of a light source to monitor its output power and adjust system parameters as may be required in operation of the source. For example, a light source may be comprised of a fiber gain medium or a semiconductor gain medium and the output power is monitored to control of the pump power supplied to the gain medium. In order to monitor the output power of the light source, a small portion of the output power can be tapped off and provided to a suitable photodetector. Common beamsplitters or optical taps may be employed for this function in the output fiber of the light source. Only a small amount of light is needed and the goal is to effect as little as possible the output power provided to an application. The taped monitoring power should be as low as possible so that all of the power available can be provided to the application. This permits the employment of smaller capacity photodetectors having low saturation levels which translates into lower cost and smaller package requirements or package space. Down to about 1% power taping with a beamsplitter or tap is possible before it becomes polarization sensitive. Thus, if the output power being monitored is in the range of 300 mW to several watts, a 1% polarization tap provides several tens of milliwatts of power that is split off, which easily exceeds the saturation power level of a desired small capacity photodetector, which may have a saturation level of 10 mW of less. If the tap or beamsplitter is then made to split-off power below 1%, it becomes polarization sensitive. The lower the split-off power, the more polarization sensitive the device becomes. If the device is polarization sensitive, continuous variations in the power level of the split-off light will occur which, of course, is not acceptable for use in monitoring the real time output power on a fiber medium. Attempts to make these devices polarization insensitive is costly and not reliable from a reproducibility standpoint. Therefore, there is a need to provide a way for providing a tap or beamsplitter which provides a polarization insensitive tapped power level which can be handled by a lower cost, smaller saturation capacity photodetector.

SUMMARY OF THE INVENTION

According to this invention, a monitoring apparatus for a high power light source comprises a fiber medium containing a high power output for an application with a first monitoring tap optically coupled to the fiber medium for removing a small portion of light from the output to monitor the output power level. A photodetector is optically coupled to receive the light portion to monitor the output power level. The photodetector, however, has a predetermined saturation level below the power level provided from the first monitoring tap. Therefore, at least one light attenuator is provided between the first monitoring tap and the photodetector to provide a level of monitoring power within a range below the saturation level of the photodetector to accurately monitor changes in the output power present on the fiber medium. The attenuator may be employed in the application of this invention may be comprised of an optical tap; a beamsplitter, such as a fiber beamsplitter; a WDM splitter; a fused coupler; a bulk optical filter or other micro-optic filter; misaligned, coupled optical fibers; or a fiber bound into a tight loop or coil to provide for optical dispersion loss from the fiber.

This invention further provides for a fiber optic beamsplitter configuration capable of less than 0.25% power splitting and which is used to split off light from power levels of greater than 300 mW from a fiber medium having high reliability under high power operation as well as being polarization insensitive. The configuration comprises a first fused fiber coupler with a splitting level of less than about 5% for splitting a small portion of light and at least one additional fused fiber coupler coupled to receive the small light portion from the first fused fiber coupler and splitting off an additional amount at a ratio of at least 20:1 such that an overall power level reduction of at least 400 times less than the original power level is achieved at the output of the second fiber coupler.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic illustration of an embodiment of the invention.

DETAILED DESCRIPTION OF THE PREFERRED EMBODIMENTS OF THE INVENTION

Reference is now made to FIG. 1 wherein one embodiment of the invention is shown for the purposes of illustrating the invention. High power light source 10, as shown here, comprises a pump assembly section 12 and a gain medium assembly section 14. The monitoring apparatus 32 of this invention comprises optical devices 24A and 24B and photodetector 26, which will be discussed in greater detail later, for monitoring the power level on fiber medium 23. Any other of a number of different types of light sources can be utilized since monitoring apparatus 32 comprising this invention is capable of being used in conjunction with any source utilized in the creation of the light output provided on fiber medium 23. Therefore, most of the components in FIG. 1 are not necessary relative to the particular application of the invention, to wit, monitoring the output power light on fiber medium 23.

In section 12, a plurality of pump laser diode sources 16A–16J have their respective outputs optically coupled to fibers 18A–18J, which are couple as inputs to N×1 coupler or multimode coupler 20. Pump laser diode sources 16A–16J are shown as 920 nm pump sources, but it is well known that these sources may be of any other wavelength capable of being provided by such laser diode sources. Ten such sources are shown in FIG. 1; however, additional source can be combined via the additional inputs 18N to coupler 20 to provide for even higher pump power levels, as is known in the art. Fibers 18A–18J may be multimode fibers. Coupler 20 combines the light sources 16A–16J into a single output on fiber 21, which is a multimode fiber, for example. Coupler 20 may be comprised of, for example, a bundle of multimode fibers 18A–18J fused together at their output ends, cleaved and then aligned and fused to multimode fiber 21 having a large NA.

It is within the skill of those in the art to combined a plurality of fiber laser pump sources as a pump source in lieu of semiconductor laser sources 16A–16J.

In the example shown in FIG. 1, the pump power on multimode fiber 21 is supplied to gain medium 22 which may be comprised of a semiconductor gain medium or amplifier capable of receiving high power levels; a laser rod or bulk gain medium, such as YAG laser or rare earth doped bulk waveguide; a fiber gain medium such as a rare earth doped fiber amplifier or fiber laser; a Raman amplifier or Raman laser; or an optical resonator, such as a cascaded Raman resonator pumped by fiber laser which, in turn, is coupled to fiber 21 to be pumped by pump assembly section 12. In any case, the output from gain medium 22 is provided on fiber medium 23 and provides for high output power to be provided to an application coupled to output fiber medium 23 by means of optical connector 30, as is well known in the art. Fiber medium 23 is generally a single mode fiber but, also could possibly be a multimode fiber. The range of power on fiber medium 23, for example, may be about 300 mW to at lest several watts of power.

In many cases, it is desirable to monitor the output power on fiber medium 23. Thus, a power tap-off is provided at fiber medium 23 and the tap-off power is provided to a photodetector. In cases particularly where the power level on fiber medium 23 is high, such as, for example, 2 W, the best that can be achieved from an optical tap, such as tap 24A, is 1%, i.e., 1% of the power on fiber medium 23 is split-off onto fiber 25 while the remaining power of about 99% is routed on fiber medium 23 to the application. The tap 24A comprises a fused fiber coupler, but other types taps or beamsplitters may be employed. Thus, in the case of the 2 W example here, this means that the power level on tap-off fiber 25 is about 20 mW, not taking into consideration any insertion losses. However, in order to save costs and provide for small compact devices as part of assembly section 14, a photodiode 26 having a saturation level below 10 mW, preferably below 5 mW, is desired for use in such monitoring applications. But, the split-off power of 20 mW is too high for the saturation level of the such a photodiode 26 so that the splitting level of tap 24A would need to be reduced below 1%. For tap 24A, this is not practical because split levels below about 1% become polarization sensitive affecting the integrity of the split-off power which can vary over time due to its polarization sensitivity. A variation in split-off power will no provide for an accurate indication of the actual power level on medium 23. However, a manner of achieving lower power levels acceptable for use with photodiode 26 is to employ an attenuator 24B in split-off fiber 25. On example of such an attenuator 24B is another 1% tap fused fiber coupler, the same as tap 24A, to split off another 1% of the power level present on spit-off fiber 25 which is provided on fiber 29 coupled to photodetector 26. In the previous example, therefore, the power level on fiber 29 would be about 0.2 mW or at least less than about 0.25% of the original, meeting the saturation level requirements of photodiode 26 having a saturation level, for example, of 5 mW or less. The remaining split power is provided on fiber 27 and is dumped or otherwise disposed of via, for example, coreless glass rod 28, which functions as an optical terminator dispersing the light within the rod and within the package. Alternatively, terminator 28 may be replaced with the terminal end of fiber 27 polished or cleaved at an angle, as is well known in the art. Also, the remaining optical power on fiber 27 may be employed for another application, such as coupled to a spectrum analyzer to monitor the spectrum characteristics of the light in fiber medium 23.

Attenuator 24B may also be any other optical device at is capable of attenuating the power level on split-off fiber 25, such as WDM splitter, a fused coupler, a bulk optical filter or other micro-optic filter. Another approach to attenuate this power to a lower level below 5 mW, for example, is to align the output end of spit-off fiber 25 with the input end of fiber 29 coupled to photodetector 26 and thereafter misalign these fibers until the power level coupled into fiber 29 is within the predetermined saturation level of photodetector 26. Then, fibers 25 and 29 are fused together or otherwise maintained by mechanical means in their misaligned relationship. Another approach is wind a sufficient length of fiber 25 in a tightly wound loop or coil so that a large portion of the light in the coil will be directed transversely out of the coiled fiber, the amount of diverted light made sufficient so that the light remaining in the output of fiber 25 coupled into photodetector 26 is within the predetermined saturation level of photodetector 26.

Although the invention has been described in conjunction with one or more preferred embodiments, it will be apparent to those skilled in the art that other alternatives, variations and modifications will be apparent in light of the foregoing description as being within the scope of the invention. For example, the purpose of the invention is monitor the power level on a fiber medium regardless of the source of the power, although in many cases, the source may be a fiber gain medium. Therefore, the invention is not limited by the source. Thus, the invention described herein is intended to embrace all such alternatives, variations and modifications as that are within the scope of the following claims.

What is claimed is:

1. A monitoring apparatus for a high power light source comprising:

a fiber medium containing a high power output for an application;

a first monitoring tap optically coupled to the fiber medium for removing a small portion of the light from the output to monitor the output power level;

a photodetector optically coupled to receive the light portion to monitor the output power level, the photodetector having a predetermined saturation level below the power level provided from the first monitoring tap;

at least one light attenuator between the first monitoring tap and the photodetector to provide a level of monitoring power within a range below the saturation level of the photodetector to accurately monitor changes in the output power level present on the fiber medium.

2. The monitoring apparatus of claim 1 wherein said monitoring tap comprises a fused fiber coupler having low insertion loss with high reliability at high power and polarization insensitive.

3. The monitoring apparatus of claim 1 wherein at least one of said monitoring tap and said light attenuator is a fused fiber coupler.

4. The monitoring apparatus of claim 3 wherein said fused fiber coupler spits off less than 10% of the high power output.

5. The monitoring apparatus of claim 1 wherein the light attenuator comprises as a fiber beamsplitter; a VVDM splitter; a fused coupler; a bulk optical filter or other micro-optic filter; misaligned, coupled optical fibers; or a fiber bound into a tight loop or coil to provide for optical dispersion loss from the fiber.

6. The monitoring apparatus of claim 1 wherein the high output power is in the range of one or more watts and the saturation level capacity of the photodetector is less than about 10 mW.

7. The monitoring apparatus of claim 1 wherein said monitoring tap and said light attenuator are about 1% optical taps.

8. The monitoring apparatus of claim 1 further comprising an optical monitor for monitoring the pump output of a pump source for pumping said fiber medium.

9. The monitoring apparatus of claim 4 wherein said pump source include a fiber gain medium, said optical monitor comprises an optical proximity coupler associated with the pump fiber medium to optically sense residual light propagating in the pump fiber medium and a photodetector to optically coupled to receive the residual light to provide a signal that is proportional to the pump light power at the pump output of the pump source.

10. The monitoring apparatus of claim 1 where a gain source is coupled to provide the power output on the fiber medium, said gain source comprising a fiber laser.

11. The monitoring apparatus of claim 10 where the fiber laser is a Raman fiber laser or a rare earth doped fiber.

12. The monitoring apparatus of claim 11 where the fiber laser is pumped by a plurality of coupled semiconductor lasers or fiber gain sources.

13. A fiber optic beamsplitter configuration which is capable of less than 0.25% power splitting and which is used to split off light from power levels of greater than 300 mW having high reliability under high power operation as well as being polarization insensitive, comprising:

a first fused fiber coupler with a splitting level of less than about 5% for splitting a small portion of light and at least one additional fused fiber coupler coupled to receive the small light portion from the first fused fiber coupler and splitting off the small light portion an additional amount at a ratio of at least 20:1 such that an overall power level reduction of at least 400 times less than the original power level is achieved.

14. The fiber optic beamsplitter configuration of claim 13 wherein the fused fiber couplers are substantially identical.

* * * * *